(12) United States Patent
Ohmukai

(10) Patent No.: US 6,686,290 B2
(45) Date of Patent: Feb. 3, 2004

(54) METHOD OF FORMING A FINE PATTERN

(75) Inventor: Ryuzo Ohmukai, Koganei (JP)

(73) Assignee: Communications Research Laboratory, Koganei (JP)

( * ) Notice: Subject to any disclaimer, the term of this patent is extended or adjusted under 35 U.S.C. 154(b) by 340 days.

(21) Appl. No.: 09/938,499

(22) Filed: Aug. 27, 2001

(65) Prior Publication Data

US 2002/0042203 A1 Apr. 11, 2002

(30) Foreign Application Priority Data

Aug. 25, 2000 (JP) ........................... 2000-256315

(51) Int. Cl.⁷ ............................................. H01L 21/302
(52) U.S. Cl. ................... 438/708; 438/707; 216/63; 216/65; 216/66; 134/1.3; 427/508; 427/553
(58) Field of Search ................. 216/63, 65, 66; 438/708, 707; 427/508, 553; 134/1.3

(56) References Cited

U.S. PATENT DOCUMENTS

H1297 H  * 4/1994 Partin et al. .............. 422/82.05
5,738,992 A * 4/1998 Cook et al. .................... 435/6
5,932,818 A * 8/1999 Novick et al. ........... 73/863.22

FOREIGN PATENT DOCUMENTS

JP    11-016856   * 1/1999

OTHER PUBLICATIONS

"A New Evanescent Wave Spectroscopy Technique for Studying Adsorption/Desorption Processes at Surfaces"; Physica Status Solidi A: Applied Research (1999); 175(1); pp 265–270; Bordo et al.*

K. Shimizu, et al., Chemical Physics, vol. 145, pp. 327–331, "A High Intensity Metastable Neon Trap", 1990.

E. L. Raab, et al., Physical Review Letters, vol. 59, No. 23, pp. 2631–2634, "Trapping of Neutral Sodium Atoms with Radiation Pressure", Dec. 7, 1987.

Tanita & Saito, Seimitsukikai [Precision Machines], vol. 47, No. 12, pp. 1541–1545, "Computer Holograms and Their Application", Dec., 1981 (with English Abstract).

G. Timp, et al., Physical Review Letters, vol. 69, No. 11, pp. 1636–1639, "Using Light as a Lens for Submicron, Neutral–Atom Lithography", Sep. 14, 1992.

A. S. Bell, et al., Microelectronic Engineering 41/42, pp. 587–590, "Atomic Lithography", 1998.

W. Z. Zhao, et al., Review of Scientific Instruments, vol. 69, No. 11, pp. 3737–3740, "A Computer–Based Digital Feedback Control of Frequency Drift of Multiple Lasers", Nov. 1998.

Tanita & Saito, Seimitsukikai [Precision Machines], vol. 47, No. 12, pp. 1541–1545, "Computer Holograms and Their Application", Dec., 1981.

* cited by examiner

*Primary Examiner*—George Goudreau
(74) *Attorney, Agent, or Firm*—Oblon, Spivak, McClelland, Maier & Neustadt, P.C.

(57) ABSTRACT

The surface of a substrate having a transmission index is irradiated with a beam of atoms having a slow enough velocity to be adsorbed on the substrate. A laser beam whose frequency is detuned by 1 to 10 gigahertz from the resonant frequency of the atoms is projected onto the substrate at an angle, producing total reflection. The atom beam is reflected at regions at which an intensity of an evanescent wave emitted at this time from the substrate surface is high, and adsorbed at regions where the intensity is low, thereby achieving atomic fabrication patterns on a substrate. By using a hologram image to create the pattern, it is possible to form an atomic fabrication patterns in which the size of features correspond to the diameter of the laser beam, enabling the size to be reduced to the diffraction limit of the laser light.

11 Claims, 4 Drawing Sheets

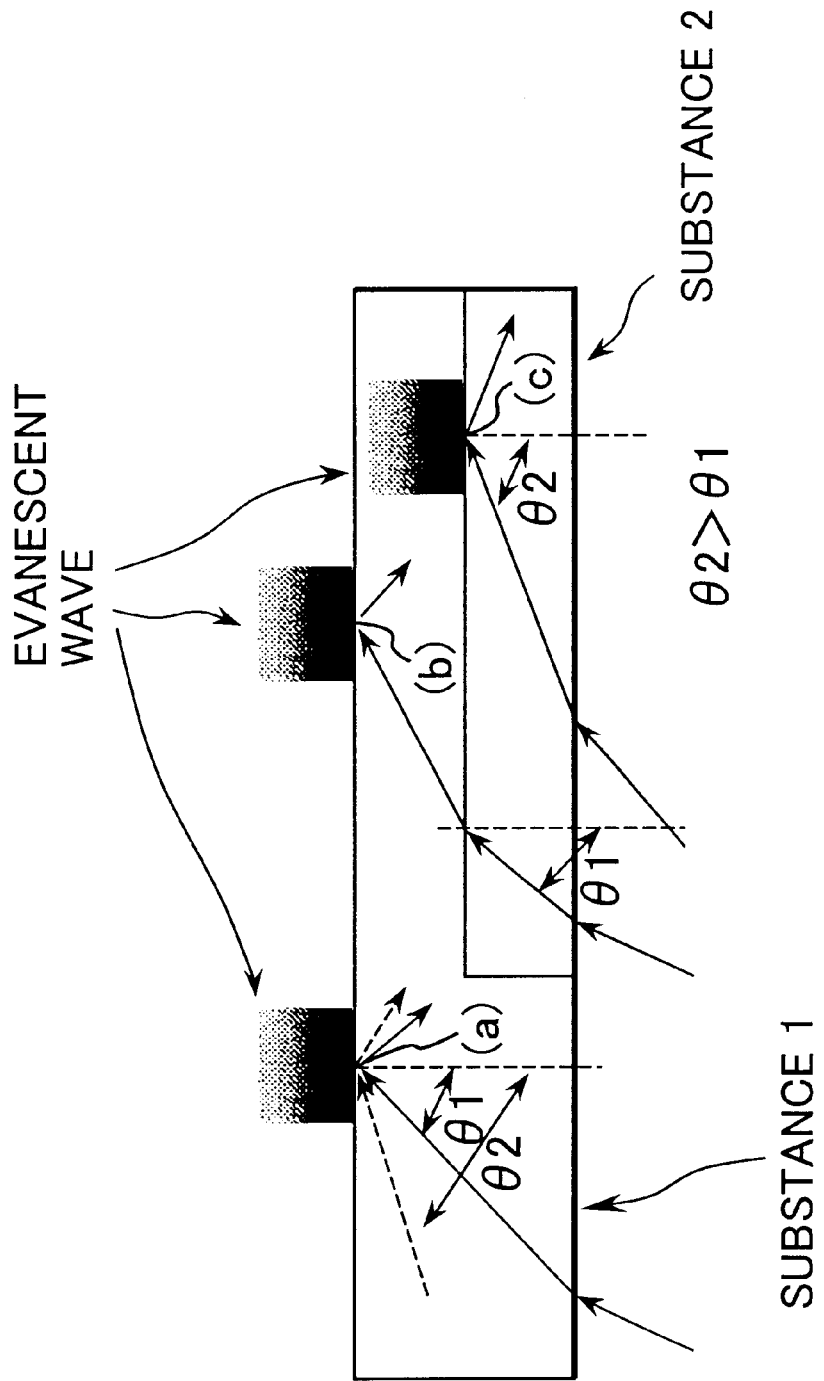

METHOD OF FORMING A FINE PATTERN

BACKGROUND OF THE INVENTION

1. Field of the Invention

The present invention relates to a method of forming fine patterns on a substrate. It particularly relates to the use of the evanescent wave to fabricate a desired fine pattern on a substrate by forming microstructures by using a laser beam to control the motion of atoms and molecules to deposit the atoms or molecules on the substrate.

2. Description of the Prior Art

The forming of submicron patterns using an optical reduction system is used extensively in the production of semiconductor integrated circuits. In this method, the surface of an object used to form the fine pattern is coated with a photosensitive resist and the optical reduction system is used to burn the fine pattern. Then, using the photosensitive resist layer as an etching mask, the surface of the object is etched to remove portions of the resist layer that are not required, thereby forming the required fine pattern. A drawback of this method is that the resist contains minute amounts of impurities that diffuse into the surface of the object used to form the pattern, affecting the electrical characteristics. There is also a method of forming a fine pattern by using a focused electron beam. However, inasmuch as this method involves sequential exposure and therefore involves the use of a photosensitive resist, it has the same problem.

Recently, there is a method that has attracted attention that uses the interaction between an optical standing wave and electrically neutral atoms. For example, Reference 1 (G. Timp, et al., "Using Light as a Lens for Submicron, Neutral-Atom Lithography", Phys. Rev. Let., 69, 1636–1639, 1992) describes, with reference particularly to the configuration shown in FIG. 1 of the reference, by using a laser beam having a wavelength of 589 nm to form a standing wave with a diameter in the order of 300 $\mu$m, through which is passed an orthogonal beam of atoms having a average velocity of 740 m/s, it should be possible to form lines having a width in the order of 10 nm. Also, in Reference 2 (A. S. Bell, et al., "Atomic Lithography", Microelectronic Engineering 41/42, 587–590, 1998), with particular reference to the configuration of FIG. 1(a) of said reference, there is described the use of two reflectors and a 425-nm laser beam to produce a standing wave with a grating-shaped pattern, which is used to form a clearly separated atomic dots in quadratic lattices with a period that is two-thirds the wavelength of the light used (283.7 nm). A beam of chromium atoms was generated and laser-cooling technique was used to collimate the beam in the transverse direction of atomic motion, a feature being the use of a laser beam having a wavelength close to the wavelength at which chromium atoms undergo resonance transitions.

It is well-known that in the interaction between atoms and optical field, when a laser is used having a wavelength that is longer than that at which the atoms undergo resonance transitions, the atoms are subjected to a dipole force urging them towards regions of high optical intensity within the laser beam. Conversely, when a laser is used having a wavelength that is shorter than the wavelength at which the atoms undergo resonance transitions, the atoms are subjected to a dipole force urging them away from regions of high optical intensity within the laser beam. In the case of Reference 2, the dipole force mentioned above is used to form the pattern on the substrate. A feature of the method is that since it does not employ a photoresist, there is no contamination of the silicon substrate surface. In the case of fine pattern forming methods of the prior art, as described in the above References 1 and 2, line-shaped or dotted patterns are produced, but because a standing wave is used, applications of the methods are limited. Even if in the future this limitation should be improved, the methods will still be limited to simple shapes such as polygons.

SUMMARY OF THE INVENTION

An object of the present invention is to provide a method of forming a fine pattern in one operation, using interaction between light and atoms.

For achieving the above object, in accordance with a first aspect, the invention provides a method of forming a fine pattern, the method comprising a step of projecting a predetermined electromagnetic wave at a first surface of an object in which the electromagnetic wave can propagate under conditions whereby the electromagnetic wave is totally reflected in the object, the first surface including at least a portion that is flat; a step of applying an intensity to an evanescent wave emitted from a second surface located at a position at which the total reflection occurs that corresponds to the position of the second surface; a step of irradiating a gas at the second surface, a kinetic energy of constituent elements of the gas being less than an energy of interaction between the evanescent wave and the constituent elements of the gas; and a step of adsorbing a portion of the constituent elements of the gas on the second surface.

In accordance with a second aspect in which a mask is used in adsorption of other atoms or molecules, the method comprises a step of projecting a predetermined electromagnetic wave at a first surface of an object in which the electromagnetic wave can propagate under conditions whereby the electromagnetic wave is totally reflected in the object, the first surface including at least a portion that is flat; a step of applying an intensity to an evanescent wave emitted from a second surface that is a surface other than the flat plate surface portion that corresponds to the position of the second surface; a step of irradiating a gas introduced in proximity to the second surface, a kinetic energy of constituent elements of the gas being less than an energy of interaction with the constituent elements of the gas; a step of adsorbing as first adsorbents a portion of the constituent elements of the gas on the second surface; and a step of selectively adsorbing second adsorbents in accordance with an amount of the first adsorbents.

In accordance with a third aspect in which the intensity of the incident electromagnetic wave is used to form a pattern, the method comprises, with respect to a beam of electromagnetic wave having a predetermined beam size, a step of applying an energy density level dependent on a position in a cross-section thereof; a step of inputting the beam to which an energy density level has been applied to a first surface of an object that can propagate the beam under conditions whereby the energy beam is totally reflected at a second surface; a step of irradiating a gas introduced in proximity to the second surface, a kinetic energy of constituent elements of the gas being less than an energy of interaction between an evanescent wave produced at the second surface and the constituent elements of the gas; and a step of adsorbing a portion of the constituent elements of the gas on the second surface corresponding to an intensity of the evanescent wave.

In accordance with a fourth aspect in which the intensity of the incident electromagnetic wave is used to form a pattern and a mask is used in adsorption of other atoms or molecules, the method comprises, with respect to a beam of electromagnetic wave having a predetermined thickness, a step of applying an energy density level dependent on a position in a cross-section thereof; a step of inputting the beam to which an energy density level has been applied to a first surface of an object that can propagate the beam under conditions whereby the energy beam is totally reflected at a second surface; a step of irradiating a gas introduced in proximity to the second surface, a kinetic energy of constituent elements of the gas being less than an energy of interaction between an evanescent wave produced at the second surface and the constituent elements of the gas; a step of adsorbing a portion of the constituent elements of the gas on the second surface corresponding to an intensity of the evanescent wave; and a step of selectively adsorbing second adsorbents in accordance with an amount of the first adsorbents.

In accordance with a fifth aspect in which monochromatic light is utilized to draw a pattern, the method according to the first or second aspects in which the step of applying an intensity to an evanescent wave emitted from a second surface located at a position at which the total reflection occurs that corresponds to the position of the second surface includes a step of using a laser beam to project a hologram image at the position of the first surface and applying an intensity to an electromagnetic wave.

In accordance with a sixth aspect which is convenient for forming a particularly large pattern, the method according to the first or second aspects in which the step of applying an intensity to an evanescent wave emitted from a second surface located at a position at which the total reflection occurs that corresponds to the position of the second surface includes a step of projecting a mask image relating to transmission of a predetermined electromagnetic wave at the position of the first surface and applying an intensity to the predetermined electromagnetic wave.

In accordance with a seventh aspect in which a plate structure is used that forms a pattern on the surface, the method according to the first or second aspects in which the step of applying an intensity that corresponds to the position of the second surface includes a step of applying an intensity to a predetermined electromagnetic wave corresponding to change in a thickness position of the object.

In accordance with an eighth aspect in which electromagnetic wave interference can be used to control transmissivity, enabling an incident electromagnetic wave intensity pattern to be provided, the method according to the first or second aspects in which the step of applying an intensity to an evanescent wave emitted from a second surface that corresponds to the position of the second surface includes a step of applying an intensity to a predetermined electromagnetic wave corresponding to positional change in transmissivity of the electromagnetic wave in the object.

In accordance with a ninth aspect in which an incident electromagnetic wave intensity pattern can be provided using positional change in surface reflectance, the method according to the first or second aspects in which the step of applying an intensity to an evanescent wave emitted from a second surface that corresponds to the position of the second surface includes a step of applying an intensity to a predetermined electromagnetic wave corresponding to a positional change in reflectance of the first surface.

In accordance with a tenth aspect in which an incident electromagnetic wave intensity pattern can be provided using positional change in surface light absorptivity, the method according to the first or second aspects in which the step of applying an intensity to an evanescent wave emitted from a second surface that corresponds to the position of the second surface includes a step of applying an intensity to a predetermined electromagnetic wave corresponding to positional change in light absorptivity of the first surface.

In accordance with an eleventh aspect in which in order to be able to perform the steps of adsorption and patterning separately and independently, the method of forming a fine pattern comprises a step of projecting a predetermined electromagnetic wave at a first surface of an object in which the electromagnetic wave can propagate under conditions whereby the electromagnetic wave is totally reflected in the object, the first surface including at least a portion that is flat; a step of applying an intensity to an evanescent wave emitted from a second surface located at a position at which the total reflection occurs that corresponds to the position of the second surface; a step of irradiating a gas at the second surface, a kinetic energy of constituent elements of the gas being less than an energy of interaction between the evanescent wave and the constituent elements of the gas; and a step of adsorbing a portion of the constituent elements of the gas on the second surface.

Further features of the invention, its nature and various advantages will be more apparent from the accompanying drawings and following detailed description of the invention.

BRIEF EXPLANATION OF THE DRAWINGS

FIG. 4 illustrates the principle of surface spatial modulation of evanescent wave intensity, by forming regions having different refractivities.

DESCRIPTION OF THE PREFERRED EMBODIMENT

Details of the embodiments of the present invention will now be explained with reference to the drawings, starting with a description of a first embodiment made with reference to FIG. 1.

Figure 1:
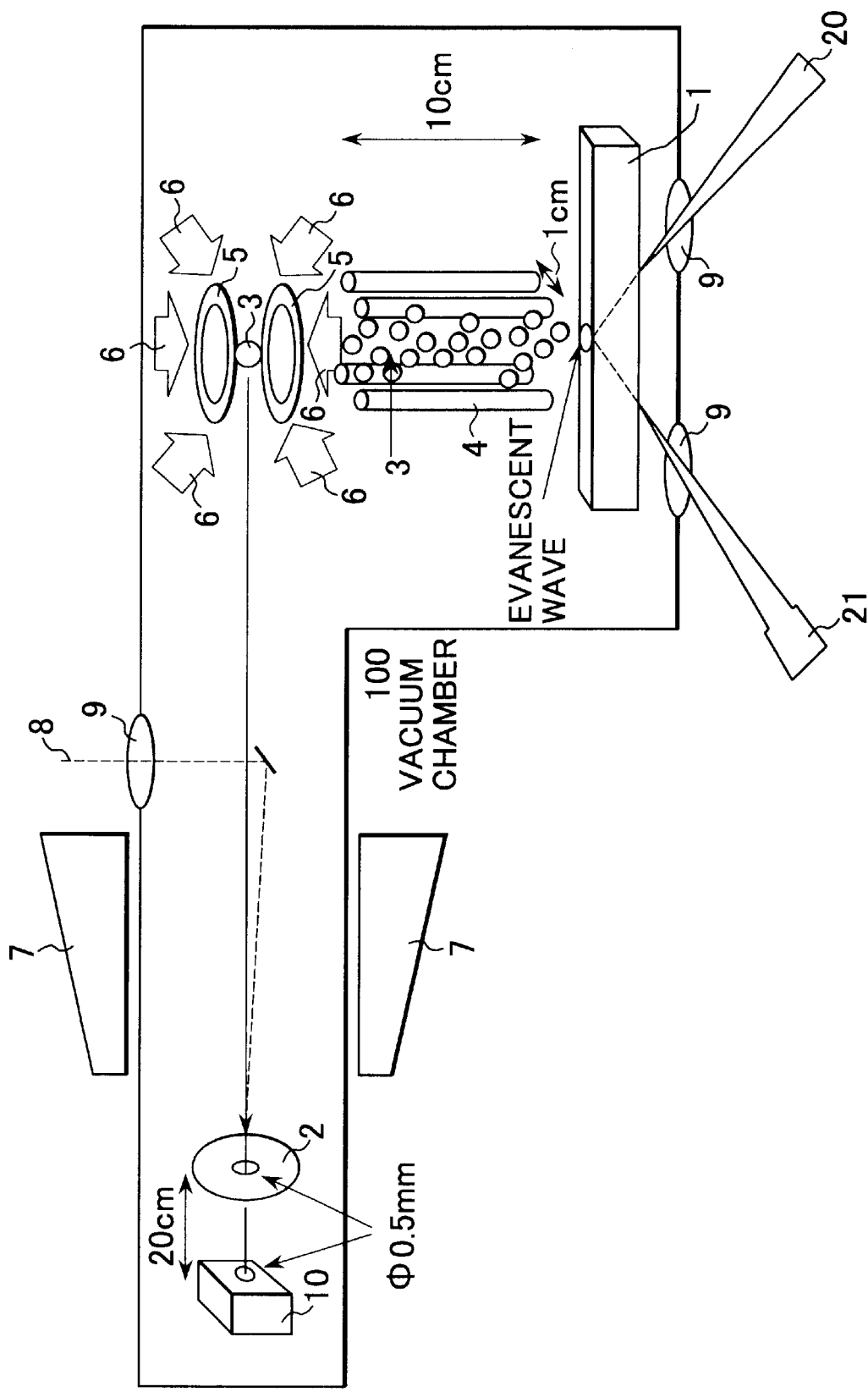
FIG. 1 is a schematic diagram showing general configuration of the method of forming a fine pattern of the present invention.

FIG. 1 is a schematic diagram showing the general configuration of the method of forming a fine pattern of this invention implemented in a vacuum chamber 100 under a high vacuum (preferably not less than $1.0 \times 10^{-8}$ Pa). The material to be used in the lithography such as In, Cr, Al or Si or the like is placed in an oven 10 where it is heated until the vapor pressure of the material is at least 10 Pa, to vaporize the material. The stream of vaporized atoms is collimated using a first pinhole provided on the oven and a second pinhole on the collimator 2, to thereby form a thermal atom beam. The diameter of the pinholes and their spacing are set so that the angle of beam divergence is not more than around 10 mrad. It is desirable to heat the oven to a temperature whereby the density of the atoms making up the beam of atoms is, directly downstream of the second pinhole, not less than $10^8$ atoms/cm$^3$, and to maintain the oven at that temperature.

The atoms of the beam have a wide velocity distribution so the scattering force is used to slow the velocity, or velocity selection is used, to form a low-velocity atomic beam. Known methods of slowing the atoms include the Zeeman tuning method, the frequency chirping method and the method using a broadband spectral light source. By using these methods, the atoms in the beam can be slowed to or below 5 m/s. It is desirable to slow at least around 50% of the atoms comprising the atomic density of the incident thermal atom beam to or below 5 m/s. The Zeeman coil 7 used in the Zeeman tuning method should be placed outside the vacuum chamber. With respect to velocity selection, the well-known technique described in Reference 3 (F. Shimizu, et al., Chem. Phys., 145 (1990), pp. 327–331) was used to obtain a spatially-divided atomic beam that had been subjected to velocity selection. Whichever the method used, the irradiation by the required laser beams should be from outside the vacuum chamber, via a view-hole.

With the thus-obtained 5 m/s or slower atomic beam as the atomic source, the well-known magneto-optical trap (MOT) described in Reference 4 (E. L. Raab, et al., Phys. Rev. Let., 59. (1987), 2631) is used to trap atoms while at the same time laser cooling is effected, cooling to a temperature at which the kinetic energy is equivalent to not more than 1 mK The MOT is constituted by anti-Helmholtz coils 5 and laser beams 6. The coils 5 can be disposed inside or outside the vacuum chamber, and a current is passed through the coils to generate a magnetic gradient in the order of 1 mT/cm. The MOT laser beams are projected through the view-hole into the vacuum chamber from six directions (±x, ±y, ±z). In accordance with the usual methods, with respect to the laser frequency, of the electron transitions of the atoms to be cooled it is desirable to select the frequency enables the most effective cooling and detune to the minus side from that transition frequency by the amount of the natural linewidth of that transition, and, for the laser intensity, to use around the saturation intensity of the electron transitions concerned. The six laser beams can be set for clockwise or counter-clockwise polarization, the use of each setting being well-known, being described in, for example, Reference 4. The system should also be fine-tuned with respect to the final velocity of the atoms thus slowed by the above method, the current passed through the anti-Helmholtz coils of the MOT, the degree of laser frequency detuning and the laser intensity, to maximize the numbers and minimize the temperature of atoms actually trapped and cooled by the MOT.

If an atom population in which the atom density is not less than $10^8/cm^3$ is trapped by the MOT and adequately cooled to or below a temperature at which the kinetic energy is equivalent to not more than 1 mK, irradiation by the MOT laser beams is stopped and the cloud of cooled atoms 3 falls some 10 cm under the force of gravity. This distance is adjusted to adjust the kinetic energy of the atoms. The cooled atoms are positioned so that they fall vertically in the direction of the gravitational force. Also, it is desirable to prepare a quadrupole magnetic field that is long enough for the atomic cloud to descend through a region focused to a diameter not exceeding 1 mm, without spatial scattering of the atom population.

For this, the quadrupole magnetic field is formed using four copper rods, each 10 cm long, set at an equal spacing of 10 mm as shown in FIG. 1. A current is then passed through the rods in mutually opposite directions to generate a maximum magnetic field of 15 mT (magnetic gradient: 30 mT/cm), forming a magnetic trap that prevents the cooled atoms descending through the magnetic trap from dispersing laterally. Within the trap, atoms are subjected to a force given by $$\vec{F} = -\mu_B \vec{\nabla} \vec{B} \qquad (1)$$

Accordingly, while the cooled atoms released from the MOT are falling through the magnetic trap, they are guided along an axis that is equidistant from the four copper rods (B=0). As shown in FIG. 1, the atoms cooled by the MOT are along the axis that is equidistant from the four copper rods, and are positioned to constitute the atomic I fabrication region located at the opposite end of the axis. The current applied to the copper rods should be fine-tuned so that with respect to the magnetic gradient of the quadrupole magnetic field constituting the magnetic trap, the guiding effect on the cooled atoms is highest at the end of the guide region where the copper rods are closest to the substrate.

The frequency of the laser beam used to generate the evanescent wave during the fabrication process is based on the resonant frequency of an atomic transition at which, under the same optical intensity and detuned frequency, the dipole force resulting from the laser field is at a maximum, from which the frequency is detuned to the plus side by several gigahertz. In the case of sodium atoms, for example, a configuration that combines an argon ion laser and a dye laser is used to generate a laser beam of wavelength 589 nm, and the lasing frequency is detuned to the high frequency side by from 1 to 10 gigahertz with respect to sodium atom $(3S_{1/2}\ F=2) \to (3P_{3/2}\ F=3)$ transitions. In the case of chromium atoms, a dye laser pumped by an argon-ion-laser was used to generate a 425-nm beam (corresponding to chromium atom $7S_3 \to 7P_4$ transition) which was detuned to the plus side by from 1 to 10 gigahertz with respect to the transition frequency. It is desirable to stabilize the frequency of the laser by using, for example, the technique described in Reference 5 (W. Z. Zhao, et al., Rev. Sci. Instrum., 69 (1998), pp. 3737–3740).

Computation is used to produce a hologram from a spatially two-dimensional pattern on the substrate 1. Methods for doing this are well-known, such as the method described in Reference 6 (Tanita & Saito, Computer Holograms and their Application, Seimitsukikai [Precision Machines], vol. 47, No. 12 (December 1981), pp. 1541–1545). This method was used to form a Fourier-transform type computer hologram.

Figure 3:
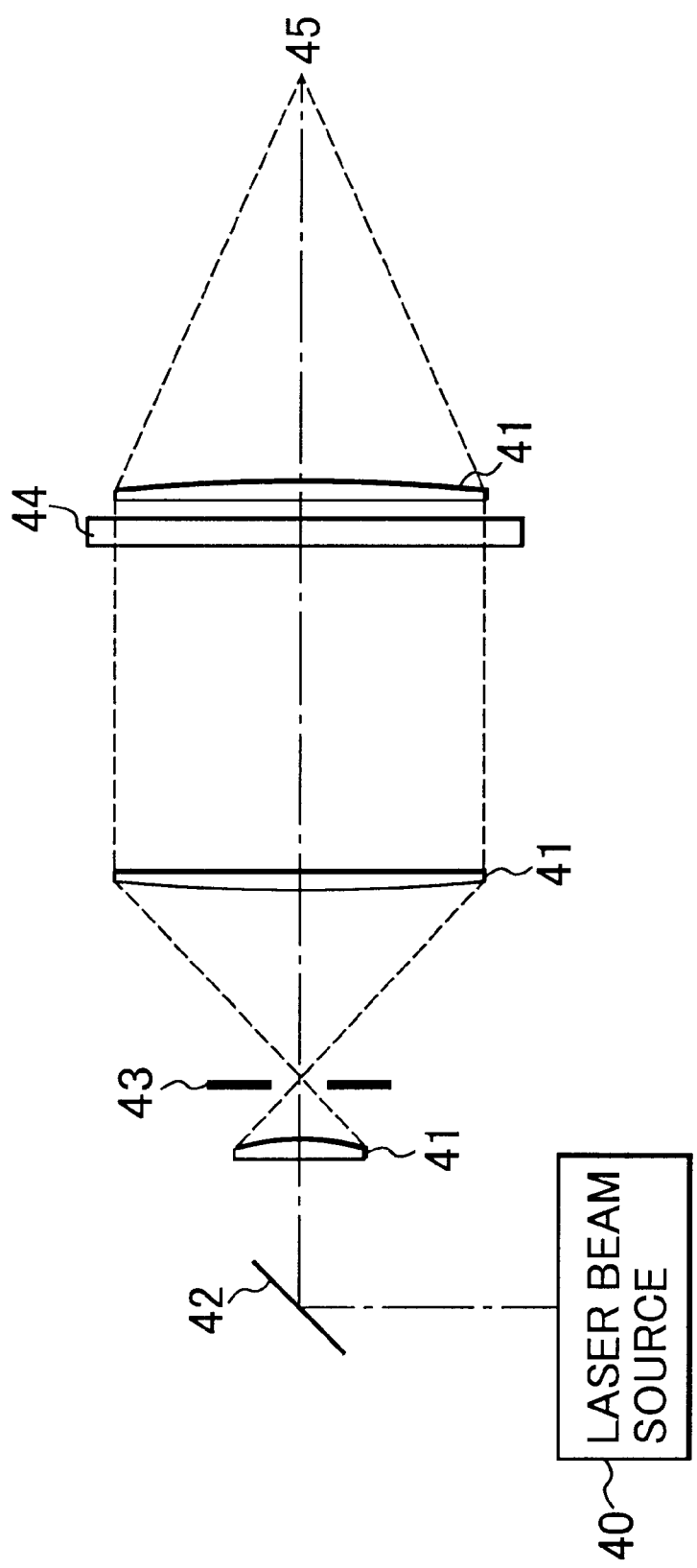
FIG. 3 shows the position of a laser light source having a spatial intensity distribution for generating an evanescent wave using a computer hologram.

Lenses 9 were used to focus the laser beam on the hologram, and the spot size was adjusted. The laser beam, having a spatial intensity distribution controlled by means of the hologram, was projected onto the substrate 1 from the lower surface and totally reflected by the substrate surface. In the case of a computer hologram image, there is no need for the object beam and reference beam required in normal holography. Instead, the light intensity distribution can be produced using only a reproduction beam as shown in FIG. 3. In the drawing, a laser beam is reflected by a mirror 42, and expanded by a expander consists of lenses 41 and a pinhole 43. The expanded laser beam is applied to a hologram 44, then focused under the substrate surface 45. An evanescent wave is generated on the upper side, which is the side opposite the side of laser beam incidence. The intensity distribution of the evanescent wave on the substrate surface reflects the spatial intensity distribution of the incident laser beam generated holographically in the total reflection plane. With respect to the intensity distribution of the evanescent wave at certain points (x, y) within the fabrication plane, the following equation shows the intensity attenuation perpendicular to the lithography plane, i.e., in the z direction.

$$I(z) = q \cdot I_0 \cdot \exp\left(-\frac{z}{z_0}\right) \quad (2)$$

Here, z is distance from the substrate, q, $z_0$ are $$q = \frac{16n^3}{[(n^2-1)(n^2+1)\cdot\cos^2\theta]}, \quad (3)$$

$$z_0 = \frac{\lambda}{[4\pi\cdot(n^2\cdot\sin^2-1)^{1/2}]},$$

where, $I_0$ is the intensity of the holographically generated laser beam at z=0 on the (x, y) fabrication plane, n is refractive index of the substrate material, and θ is the angle of incidence of the laser beam. As shown by these equations, since the intensity of the evanescent wave rapidly attenuates over a short distance in the order of the wavelength of the light, the atoms are subjected to a dipole force. Whether in direction the force is a repelling force or an attracting force, with respect to atoms projected at the substrate, is determined by the sign of the detuning of the laser frequency, either plus or minus. A plus sign means a repelling force, and a minus sign means an attracting force. As described above, the frequency is detuned to the plus side by 1 to 10 gigahertz, so owing to the repelling force, the evanescent wave acts like a mirror that reflects the atoms. The dipolar potential produced by the evanescent wave is given by the following equation.

$$U(z) = \frac{\hbar}{2}\cdot\delta\cdot\ln\left[i + \frac{I(z)}{I_s}\frac{\gamma^2}{\delta^2+\gamma^2}\right]. \quad (4)$$

Here, δ is the detuning of the laser frequency from the resonance of the atomic transition, 2γ is the natural linewidth of atomic transition, and $I_s$ is saturation intensity with respect to the atomic transition.

If $k_B$ is the Boltzman constant, m is the mass of the atoms concerned and T is the temperature of the cooled atoms, the intensity of the laser beam used to generate the evanescent wave can be set by using $<v^2>$ that satisfies equation (5) thus:

$$K_B \cdot T = m \cdot <V^2>. \quad (5)$$

to satisfy the condition of equation (6) at the location of the reflecting atoms on the substrate.

$$\sqrt{R\cdot\langle v^2\rangle + 2\cdot g\cdot l} < \sqrt{\frac{2\cdot U(0)}{m}}. \quad (6)$$

Here, l is the natural falling distance of the atoms guided by the quadrupole magnetic field, g is gravitational acceleration, and m is atomic mass. R is a coefficient indicating the atomic velocity within the cooled atom population up to which the atoms concerned will be reflected by the evanescent wave. With respect to the cooled atom population temperature T of equation (6), this indicates the condition under which atoms up to those having a kinetic energy corresponding to R×T within the population can be reflected on the substrate by the evanescent wave. The value of R should be optimized, taking into consideration the final state of the fabricated structures and the laser beam intensity and other system conditions.

From the foregoing explanation, it can be readily understood that the width of fabricated lines on the substrate surface can be controlled by changing the laser beam intensity. The falling cooled atoms 3 impinging on the evanescent wave region satisfy equation (4), and so are reflected at portions of the fabrication region where there is light. Where there is no light, the atoms form a deposition on the substrate 1. Thus, when an evanescent wave is generated in the hologram using laser light having a spatial intensity distribution, atoms are reflected or deposited on the substrate in accordance with a spatial pattern formed by the hologram. Atoms that are reflected continue to be thus moved until they are at a position where there is no evanescent wave or they are outside the fabrication area. As a result, atoms are deposited on the substrate surface in a pattern that reflects the spatial pattern reproduced by the computer hologram.

In this embodiment in which four copper rods are used to guide the cooled atoms, the position at which the cooled atoms fall onto the substrate is controlled by independently adjusting the current applied to the rods to modify the spatial profile of the quadrupole magnetic field. Thus, two-dimensional control and extension of the fabrication area is possible. It is not essential to employ a hologram-based image for the patterning. Instead, a light intensity pattern can be applied, using a type of photo-mask that is well-known in conventional photolithography.

Fabrication of atoms with the evanescent wave can be carried out even when, in order to spatially modulate the irradiating laser beam, a pattern is provided on the reverse side of the substrate, or a pattern is provided that comprises differences in refractive indices in the substrate, or a pattern is provided based on evanescent wave intensities at the patterning surface. The irradiating laser beam can also be spatially modulated by spatially adjusting the refractive index in the vicinity of the total reflection surface of the substrate. The configuration shown in FIG. 4, shows when the refractive indices in the vicinity of the reverse side of the substrate are n1, n2. For example, when the substrate is doped, the refractive index of the substrate, as substance 1, is n1, and that with the dopant, as substance 2, is n2, where n1<n2. FIG. 4(b) shows when an evanescent wave is produced on the substrate surface by total reflection at the interface between the vacuum and substance 2 when the angle of beam incidence is $\theta_1$, while FIG. 4(c) shows when an evanescent wave is produced on the substrate surface when there is total reflection at the interface between substance 1 and substance 2 with an angle of beam incidence of $\theta_2$. FIG. 4(a) shows the production of an evanescent wave when there is total reflection at the interface between the vacuum and substance 1 whether the angle is $\theta_1$ or $\theta_2$.

Consequently, since an evanescent wave is generated within the substrate at the location of the substance 2 by projecting the beam at an angle of incidence that is larger than the critical angle of total reflection at the interface between substance 1 and substance 2, the surface intensity undergoes attenuation that corresponds to the depth. Also, where there is no substance 2, an evanescent wave is generated on the substrate surface whether the angle is $\theta_1$ or $\theta_2$. Thus, the presence or absence of substance 2 can be used to control the intensity of the evanescent wave on the substrate surface. The above method can be used by, for example, changing the refractive index of a BK7 (optical glass) substrate from 1.5 to 1.76 by doping it with sapphire ($Al_2O_3$) and a system configuration used in which, in order to generate an evanescent wave, the angle of laser beam incidence is at least 59 degrees.

Figure 2:
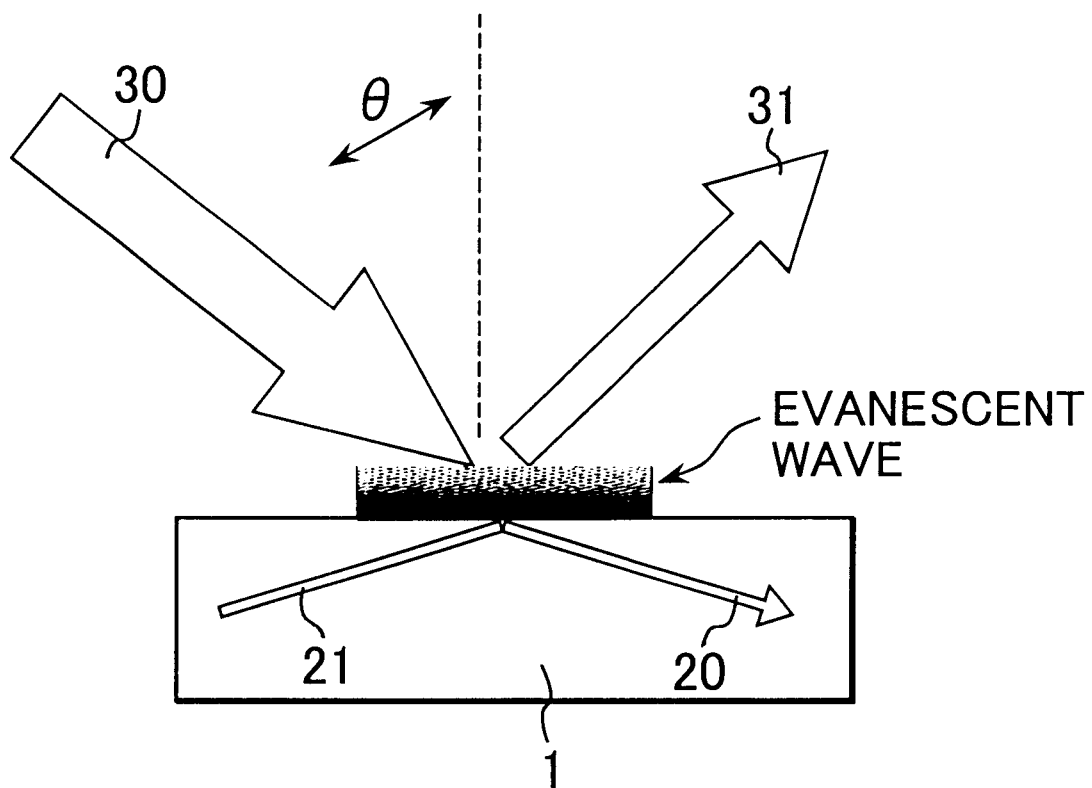
FIG. 2 illustrates the interaction at the atomic pattern plane between an evanescent wave and an atom beam

In the above-described example, the atoms of the atom population 3 cooled by a MOT are guided vertically down by a quadrupole magnetic field to be deposited on the substrate 1. However, patterning can be effected using an atomic (or molecular) beam projected from a direction whereby the beam forms an angle θ with respect to the substrate surface, as shown in FIG. 2. In this case, with v1 as the maximum atomic velocity within the beam and m as the mass of the atoms concerned, the following equation, $$v1 \cdot \cos\theta < \sqrt{\frac{2 \cdot U(0)}{m}}, \quad (7)$$

should be satisfied by controlling the velocity of the atoms, or by velocity selection, or by selecting the angle of incidence, or by adjusting the optical intensity or detuned frequency used to produce the evanescent wave, or these can be mutually adjusted.

The above explanations have been made with reference to a single beam of atoms. However, the above embodiments can also be implemented using a plurality of atomic beams. In this case, a plurality of atom sources are used, and after the atoms are trapped by a MOT and cooled, they are brought down onto the substrate to form the required pattern. For this, lasers have to be prepared that have the requisite operating wavelengths for the type of atoms concerned. It is also possible to use different hologram images to produce different substrate patterns according to the type of atoms.

The above embodiments have been described with reference to the substrate being simultaneously irradiated by an atomic beam and a laser beam. When it is possible to use laser beams that are more powerful by a sufficient margin than the ones described above, a layer of atoms can be formed beforehand on the substrate by adsorption of atoms from the atomic beam. This could then be irradiated by monochromatic light detuned to the plus side, as described above, to produce an evanescent wave, causing atoms forming the atomic layer to be scattered off from portions irradiated by the powerful laser beam, leaving the layer of adsorbed atoms on portions not irradiated by the laser beam.

When the atoms thus adsorbed result in a frequency shift in the lines of the absorption spectrum thereof, or in an increase in line width, the frequency of the irradiating laser beam can be adjusted to find the optimum frequency for exhibiting the desired effect. Even when the width of absorption spectrum lines increases, adsorbed atoms can be scattered off by irradiation with a sufficiently powerful laser beam.

An advantage of this method is that there is no need to reduce atom beam velocities. The system apparatus is therefore simpler and costs less to manufacture. Another advantage is that, in addition to the described techniques of using computer holograms and the like, a desired pattern can be formed on the substrate by spatially sweeping the laser beam. This makes it possible to use laser beams focused to the diffraction limit to form patterns having narrow line widths corresponding to the beam diameter.

In the foregoing explanation, a laser is used as the source for the electromagnetic wave. However, it can be readily understood that light from another source can be used provided the light is monochromatic. For example, it is to be understood that the same effect can be expected using monochromatic light obtained from a free electron laser generated by an elementary particle accelerator, or from the synchrotron radiation.

Thus, as described in the foregoing, the present invention provides the following effects.

The first aspect uses interaction between the evanescent wave and the constituent elements of a gas, so that even without using a standing wave with a reflector, as in the prior art methods, atoms can be affixed to form a required pattern on the patterning surface, without using substances that contaminate the substrate surface.

In accordance with the second aspect, the surface on which atoms, molecules or other sub-micron particles have been affixed, using the interaction between the evanescent wave and the constituent elements of a gas, can be replaced in subsequent steps by suitable substances. This enables a simpler system apparatus to be used to form the required patterns, and it also increases the types of substances that can be adsorbed to the substrate, without using substances that contaminate the substrate surface.

The third aspect of the invention also uses the interaction between the evanescent wave and the constituent elements of a gas, with the patterns being formed by adjusting the intensity of the incident electromagnetic wave. Again, therefore, without using a standing wave with a reflector, as in the prior art methods, atoms can be affixed to form a required pattern on the substrate without using substances that contaminate the substrate surface.

In accordance with the fourth aspect, the surface on which atoms, molecules or other sub-micron particles have been affixed using the interaction between the evanescent wave and the constituent elements of a gas can be replaced in subsequent steps by suitable substances, with the patterns being formed by adjusting the intensity of the incident electromagnetic wave. This enables a simpler system apparatus to be used to form the required patterns, and it also increases the types of substances that can be adsorbed to the substrate, without using substances that contaminate the substrate surface.

In the fifth aspect, a hologram image is used to form a pattern based on light intensities to deposit atoms at some locations and not at others. The advantage of the hologram image is that it can be used to produce a two-dimensional pattern of fabrication.

In the sixth aspect, a photo-mask is used to form an optical intensity pattern to cause atoms to be deposited at some locations and not at others, making it simpler to produce an intensity pattern. In accordance with the seventh aspect, a substrate thickness pattern is formed beforehand to deposit the atoms on the substrate; this can be readily applied to other types of patterns. In accordance with the eighth aspect, a pattern is formed corresponding to the pattern of transmissivity factors of the substrate, which can be readily applied to other types of patterns. In accordance with the ninth aspect, a pattern is formed corresponding to the reflectance factors of the substrate, which also can be readily applied to other types of patterns. In accordance with the tenth aspect, a pattern is formed corresponding to the light absorption factors of the substrate, which also can be readily applied to other types of patterns. In accordance with the eleventh aspect, a layer of atoms are adsorbed on the substrate beforehand, which simplifies the system apparatus by eliminating the need to cool the atoms.

What is claimed is:

1. A method of forming a fine pattern comprising:
   a step of projecting a predetermined electromagnetic wave at a first surface of an object in which the electromagnetic wave can propagate under conditions whereby the electromagnetic wave is totally reflected in the object, the first surface including at least a portion that is flat;
   a step of applying an intensity to an evanescent wave emitted from a second surface located at a position at which the total reflection occurs that corresponds to the position of the second surface;

a step of irradiating a gas at the second surface, a kinetic energy of constituent elements of the gas being less than an energy of interaction between the evanescent wave and the constituent elements of the gas; and a step of adsorbing a portion of the constituent elements of the gas on the second surface.

2. A method of forming a fine pattern comprising:

a step of projecting a predetermined electromagnetic wave at a first surface of an object in which the electromagnetic wave can propagate under conditions whereby the electromagnetic wave is totally reflected in the object, the first surface including at least a portion that is flat;

a step of applying an intensity to an evanescent wave emitted from a second surface that is a surface other than the flat plate surface portion that corresponds to the position of the second surface;

a step of irradiating a gas introduced in proximity to the second surface, a kinetic energy of constituent elements of the gas being less than an energy of interaction with the constituent elements of the gas;

a step of adsorbing as first adsorbents a portion of the constituent elements of the gas on the second surface; and a step of selectively adsorbing second adsorbents in accordance with an amount of the first adsorbents.

3. A method of forming a fine pattern comprising:

a step of applying, with respect to a beam of electromagnetic wave having a predetermined beam size, an energy density level dependent on a position in a cross-section thereof;

a step of inputting the beam to which an energy density level has been applied to a first surface of an object that can propagate the beam under conditions whereby the energy beam is totally reflected at a second surface;

a step of irradiating a gas introduced in proximity to the second surface, a kinetic energy of constituent elements of the gas being less than an energy of interaction between an evanescent wave produced at the second surface and the constituent elements of the gas; and a step of adsorbing a portion of the constituent elements of the gas on the second surface corresponding to an intensity of the evanescent wave.

4. A method of forming a fine pattern comprising:

a step of applying, with respect to a beam of electromagnetic wave having a predetermined thickness, an energy density level dependent on a position in a cross-section thereof;

a step of inputting the beam to which an energy density level has been applied to a first surface of an object that can propagate the beam under conditions whereby the energy beam is totally reflected at a second surface;

a step of irradiating a gas introduced in proximity to the second surface, a kinetic energy of constituent elements of the gas being less than an energy of interaction between an evanescent wave produced at the second surface and the constituent elements of the gas;

a step of adsorbing a portion of the constituent elements of the gas on the second surface corresponding to an intensity of the evanescent wave; and a step of selectively adsorbing second adsorbents in accordance with an amount of the first adsorbents.

5. The method according to claim 1 or 2, in which the step of applying an intensity to an evanescent wave emitted from a second surface located at a position at which the total reflection occurs that corresponds to the position of the second surface includes a step of using a laser beam to project a hologram image at the position of the first surface and applying an intensity to an electromagnetic wave.

6. The method according to claim 1 or 2, in which the step of applying an intensity to an evanescent wave emitted from a second surface located at a position at which the total reflection occurs that corresponds to the position of the second surface includes a step of projecting a mask image relating to transmission of a predetermined electromagnetic wave at the position of the first surface and applying an intensity to the predetermined electromagnetic wave.

7. The method according to claim 1 or 2, in which the step of applying an intensity that corresponds to the position of the second surface includes a step of applying an intensity to a predetermined electromagnetic wave corresponding to change in a thickness position of the object.

8. The method according to claim 1 or 2, in which the step of applying an intensity to an evanescent wave emitted from a second surface that corresponds to the position of the second surface includes a step of applying an intensity to a predetermined electromagnetic wave corresponding to positional change in transmissivity of the electromagnetic wave in the object.

9. The method according to claim 1 or 2, in which the step of applying an intensity to an evanescent wave emitted from a second surface that corresponds to the position of the second surface includes a step of applying an intensity to a predetermined electromagnetic wave corresponding to positional change in reflectance of the first surface.

10. The method according to claim 1 or 2, in which the step of applying an intensity to an evanescent wave emitted from a second surface that corresponds to the position of the second surface includes a step of applying an intensity to a predetermined electromagnetic wave corresponding to positional change in light absorptivity of the first surface.

11. A method of forming a fine pattern comprising:

a step of projecting a predetermined electromagnetic wave at a first surface of an object in which the electromagnetic wave can propagate under conditions whereby the electromagnetic wave is totally reflected in the object, the first surface including at least a portion that is flat;

a step of applying an intensity to an evanescent wave emitted from a second surface located at a position at which the total reflection occurs that corresponds to the position of the second surface;

a step of irradiating a gas at the second surface, a kinetic energy of constituent elements of the gas being less than an energy of interaction between the evanescent wave and the constituent elements of the gas; and a step of adsorbing a portion of the constituent elements of the gas on the second surface.

* * * * *

UNITED STATES PATENT AND TRADEMARK OFFICE
CERTIFICATE OF CORRECTION

PATENT NO. : 6,686,290 B2 Page 1 of 1
DATED : February 3, 2004
INVENTOR(S) : Ohmukai It is certified that error appears in the above-identified patent and that said Letters Patent is hereby corrected as shown below:

<u>Title page,</u>
Item [73], Assignee, should read:
-- [73] Assignee: Communications Research Laboratory, Independent Administrative Institution, Koganei (JP) --

Signed and Sealed this

Twentieth Day of April, 2004

JON W. DUDAS
*Acting Director of the United States Patent and Trademark Office*